(12) United States Patent
Kim

(10) Patent No.: US 7,675,807 B2
(45) Date of Patent: Mar. 9, 2010

(54) SEMICONDUCTOR MEMORY DEVICE HAVING A WORD LINE STRAP STRUCTURE AND ASSOCIATED CONFIGURATION METHOD

(75) Inventor: Jin-Young Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 431 days.

(21) Appl. No.: 11/764,381

(22) Filed: Jun. 18, 2007

(65) Prior Publication Data

US 2008/0068908 A1    Mar. 20, 2008

(30) Foreign Application Priority Data

Sep. 19, 2006    (KR) .................... 10-2006-0090571

(51) Int. Cl.
*G11C 8/00*    (2006.01)
(52) U.S. Cl. .............. 365/230.03; 365/203; 365/230.01
(58) Field of Classification Search ............ 365/230.03, 365/203, 230.01
See application file for complete search history.

(56) References Cited

U.S. PATENT DOCUMENTS 5,841,688 A * 11/1998 Sukegawa et al. ............. 365/63

FOREIGN PATENT DOCUMENTS

| JP | 2000-058785 | 2/2000 |
|---|---|---|
| JP | 2001-168302 | 6/2001 |
| JP | 2002015579 A | 1/2002 |
| JP | 2004-221374 | 8/2004 |
| KR | 1020000018434 A | 4/2000 |
| KR | 1020070082265 A | 8/2007 |

* cited by examiner

*Primary Examiner*—Son Dinh
*Assistant Examiner*—Nam Nguyen
(74) *Attorney, Agent, or Firm*—Volentine & Whitt, PLLC

(57) ABSTRACT

A semiconductor memory device having a memory cell array with sub-memory cell arrays arranged in a bit line direction and a word line direction which is perpendicular to the bit line direction. The memory cell arrays including a plurality of memory cells. The memory device further including sense amplifying portions arranged between the sub-memory cell arrays in the bit line direction, contact and conjunction portions arranged between the sub-memory cell arrays in the word line direction and conjunction portions arranged between the sense amplifiers in the word line direction. A main word line overlaps a word line between the sub-memory cell arrays arranged in the word line direction.

28 Claims, 8 Drawing Sheets

SEMICONDUCTOR MEMORY DEVICE HAVING A WORD LINE STRAP STRUCTURE AND ASSOCIATED CONFIGURATION METHOD

CROSS-REFERENCE TO RELATED APPLICATION

This U.S. non-provisional application claims priority under 35 U.S.C. §119 of Korean Patent Application No. 2006-90571 filed on Sep. 19, 2006, the entire contents of which are hereby incorporated by reference.

BACKGROUND OF THE INVENTION

1. Field of the Invention

Embodiments of the invention relate to a semiconductor memory device. More particularly, embodiments of the invention relate to a semiconductor memory device having a word line strap structure.

2. Discussion of Related Art

A typical semiconductor memory device having a word line strap structure comprises a main word line made of metal which crosses over a memory cell array region. A word line made of poly crosses a sub-memory cell array unit of the memory cell array and overlaps the main word line. The main word line is connected to the word line of the memory cell array.

Certain semiconductor memory devices include a word line strap structure which provides the advantage of reducing load of the word line. However, word line strap structures are rarely utilized in memory devices because it's difficult, if not impossible, to reduce the width of the metal line by using conventional metal processing technology. In addition, efficiency rates for reducing the layout area size are relatively low. In view of recent developments related to metal processing technology, it may be possible to reduce the width of the metal line, thereby allowing for the use of a word line strap structure in memory devices.

FIG. 1 shows an arrangement of a memory cell array of a conventional semiconductor memory device employing a word line strap structure. The memory cell array comprises sub-memory cell arrays SMCA, sense amplifying portions SA, contact portions CT, and conjunction portions CJ. Sub-memory cell array SMCA and sense amplifying portion SA are alternately arranged in a bit line BL direction. Sub-memory cell array SMCA and the contact portion CT are alternately arranged in a word line WL direction. Sense amplifying portion SA and conjunction portion CJ are alternately arranged in a word line WL direction. The word line WL and bit line BL are arranged on a lower layer of each of the sub-memory cell arrays SMCA. Memory cells (not shown) of the array are arranged between the word line WL and the bit line BL. A main word line NWL is made of metal and arranged on an upper layer of each of the sub-memory cell arrays SMCA in a word line WL direction to overlap word line WL. The main word line NWL and the corresponding word line WL of each of the sub-memory cell arrays SMCA are connected to each other.

FIG. 2 shows a portion of the memory cell array arrangement of FIG. 1 where the word line is arranged on the lower layer of the sub-memory cell array SMCA, and the main word line is arranged on the upper layer of the sub-memory cell array SMCA to overlap the word line. On a lower layer of the sense amplifying portion SA (not shown), a PMOS sense amplifier, an NMOS sense amplifier, a column selecting gate, and a pre-charge circuit are arranged. A lower layer of the conjunction portion CJ includes a driver for driving the PMOS sense amplifier, a driver for driving the NMOS sense amplifier, and a control circuit. A contact CON connects the main word line NWL and the corresponding word line WL of the sub-memory cell arrays SMCA are arranged at a central portion of contact portion CT. That is, only contact CON is arranged on contact portion CT.

In view of advances in metal processing technology, it's possible to reduce the width E of the metal line disposed on the upper layer. However, it is difficult to reduce the length C of conjunction portion CJ because the PMOS sense amplifier driver circuit, the NMOS sense amplifier driver circuit and the control circuit are all arranged in the conjunction portion CJ having the same width D as the width of the region where sense amplifying portion SA is arranged. Thus, the efficiency for reducing the layout area size of the memory cell array is relatively low. In order to reduce the length of this region, a method for alternately arranging the PMOS transistor driver and the NMOS sense amplifier driver which comprise a large transistor in the conjunction portion CJ disposed between the sense amplifying portion SA may be considered. However, a drawback with this method is that the driving ability of the PMOS transistor driver and the NMOS transistor driver deteriorate. This occurs because all of the PMOS sense amplifiers and the NMOS sense amplifiers arranged in the sense amplifying portion SA are driven by the PMOS sense amplifier driver and the NMOS sense amplifier driver which are arranged on the upper and lower layers of the memory array.

SUMMARY OF THE INVENTION

Exemplary embodiments of the present invention are directed to a semiconductor memory device having a word line strap structure in which the length of the region where the conjunction portion of the memory cell array is arranged is reduced. In an exemplary embodiment, the semiconductor memory device utilizes a memory cell array. The memory cell array includes sub-memory cell arrays, sense amplifying portions, contact and conjunction portions, conjunction portions, and a main word line. The sub-memory cell arrays are arranged in a bit line direction and a word line direction which is perpendicular to the bit line direction. Each of the sub-memory cell arrays include a plurality of memory cells. The sense amplifying portions are arranged between the sub-memory cell arrays in the bit line direction. The contact and conjunction portions are arranged between the sub-memory cell arrays in the word line direction. The conjunction portions are arranged between the sense amplifiers in the word line direction. The main word line overlaps a word line of the sub-memory cell arrays in the word line direction.

DESCRIPTION OF EMBODIMENTS

Figure 1:
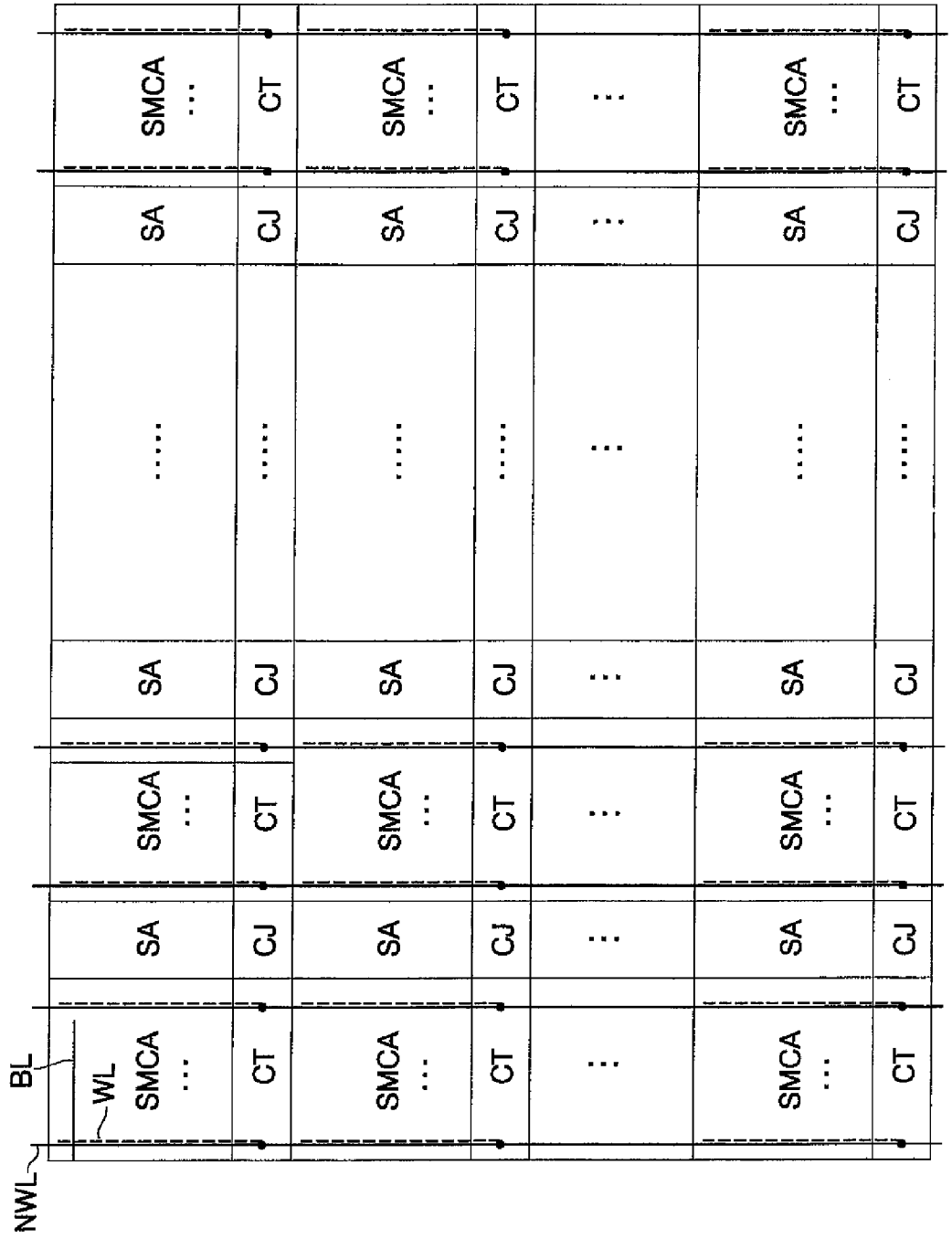
FIG. 1 shows an arrangement of a memory cell array of a conventional semiconductor memory device having a word line strap structure.
Figure 2:
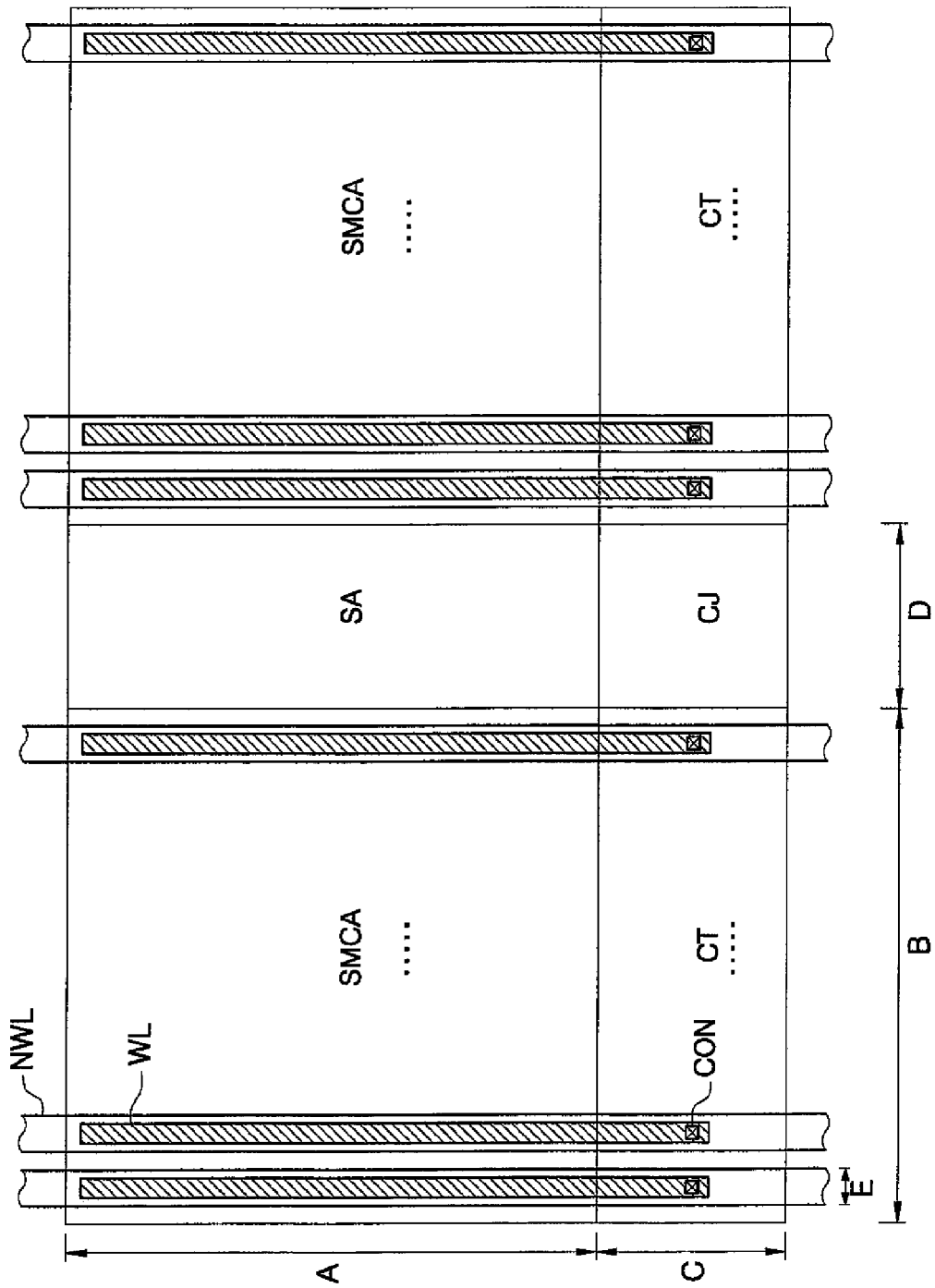
FIG. 2 shows a portion of the memory cell array of FIG. 1.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 3:
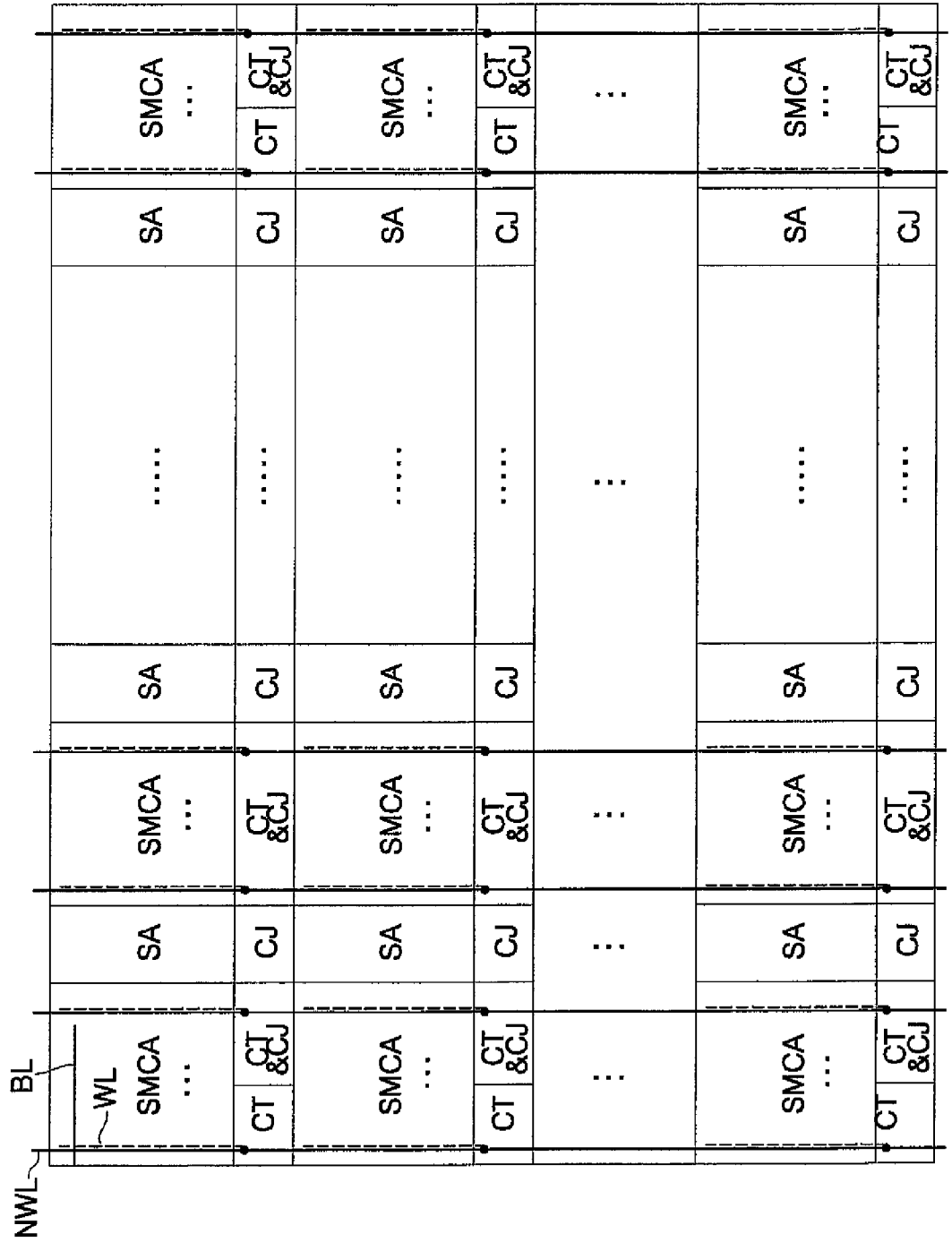
FIG. 3 shows a memory cell array of a semiconductor memory device having a word line strap structure according to an exemplary embodiment of the present invention.

FIG. 3 shows a memory cell array of a semiconductor memory device having a word line strap structure according to an exemplary embodiment of the present invention. The memory cell array includes a sub-memory cell array SMCA and a sense amplifying portion SA alternately arranged in a bit line BL direction. A contact and conjunction portion CT & CJ are arranged between sub-memory cell arrays SMCA arranged in a word line WL direction. The conjunction portions CJ are disposed between the sense amplifying portions SA in the word line WL direction. In contrast to the contact portions CT of the conventional cell array shown in FIG. 1, the contact and conjunction portions CT & CJ are combined and disposed between SMCA's.

In FIG. 3, the sub-memory cell arrays SMCA may be located toward an edge of the memory cell array and contact portion CT is disposed between the sub-memory cell arrays SMCA in a word line WL direction. The contact and conjunction portions CT & CJ are also disposed between the SMCA in a word line direction together with the contact portions CT in a bit-line direction. Alternatively, the contact portion CT may be replaced with a contact and conjunction portion CT & CJ. The length of the region where the conjunction CT and contact and conjunction portions CT & CJ are arranged becomes shorter by dispersely locating some circuits in the CT & CJ portions that were previously located in the conjunction portion CJ. In this manner, additional circuits are located in the CT & CJ region, thereby reducing the layout area size of the memory cell area.

Figure 4:
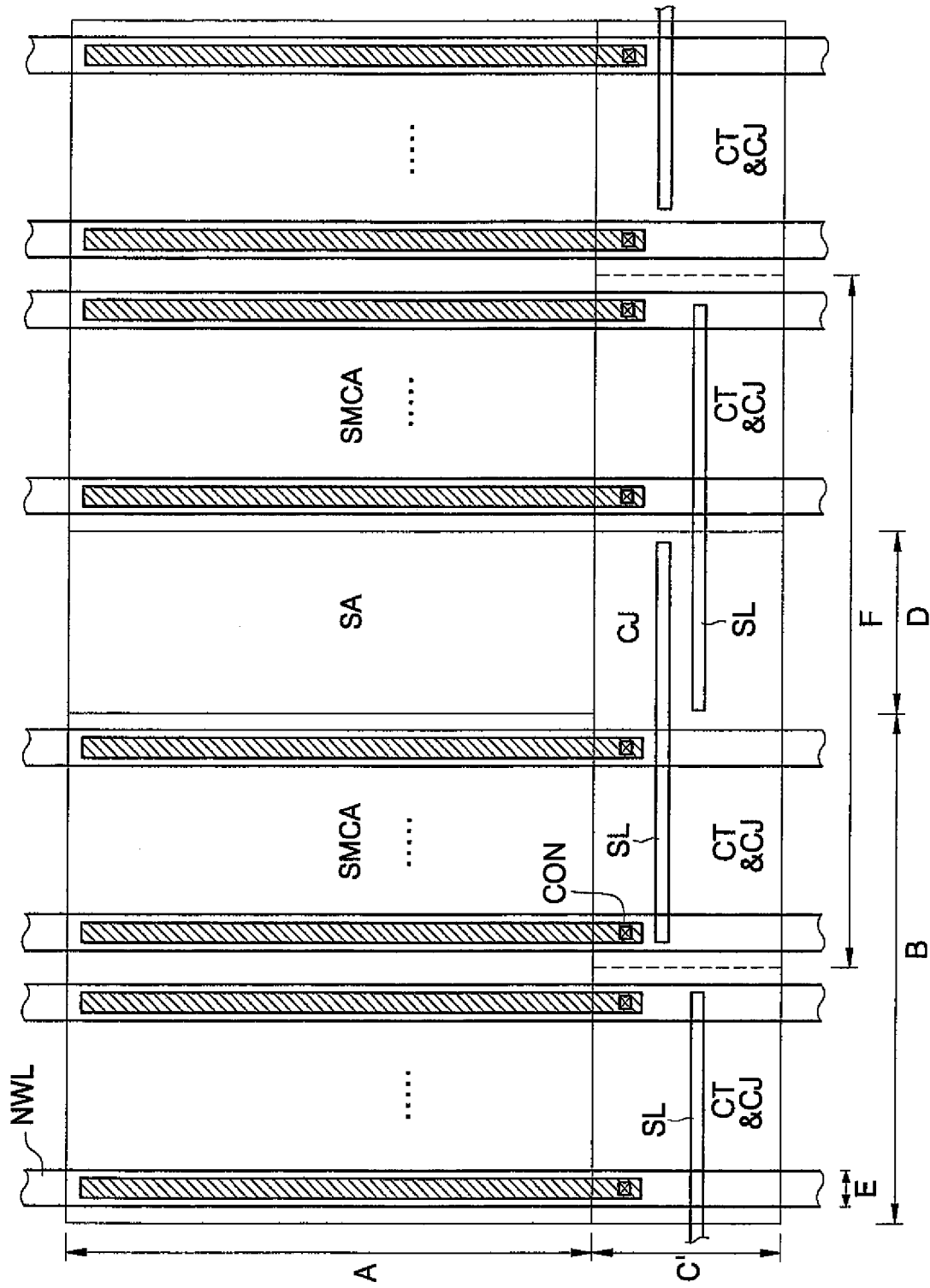
FIG. 4 shows a portion of the memory cell array of FIG. 3.

FIG. 4 illustrates a portion of the memory cell array of FIG. 3 where the contact and conjunction portions CT & CJ located on both sides of the conjunction portion CJ are represented by a dotted line and divided into two regions. The circuits (not shown) for sense amplifying portion SA adjacent to conjunction portion CJ in a bit-line direction are arranged in the conjunction portion CJ as well as the contact and conjunction portion CT & CJ adjacent to conjunction portion CJ. Circuits included in the conjunction portion CJ are also dispersed in the contact and conjunction portions CT & CJ arranged within region having width F. The contacts CON are located in an area other than the center of contact and conjunction portion CT & CJ. A word line WL of the memory array is arranged on a lower layer of the region which overlaps an upper layer where sub-memory cell array SMCA and main word line NWL, made of metal, are disposed.

On the lower layer of the semiconductor (not shown) where the sense amplifying portion SA is disposed, a PMOS sense amplifier, an NMOS sense amplifier, a column selecting gate, and a pre-charge circuit are formed. Also on the lower layer where conjunction CJ and contact and conjunction portions CT & CJ are disposed, a driver for driving the PMOS sense amplifier, a driver for driving the NMOS sense amplifier, and a control circuit are also dispersely formed. A contact CON for connecting main word line NWL and corresponding word line WL of sub-memory cell arrays SMCA is disposed in the contact portion CT. A signal line SL connects a circuit in conjunction portion CJ between sense amplifying portion SA and a circuit in the contact and conjunction portion CT & CJ in a bit line BL direction.

Figure 5:
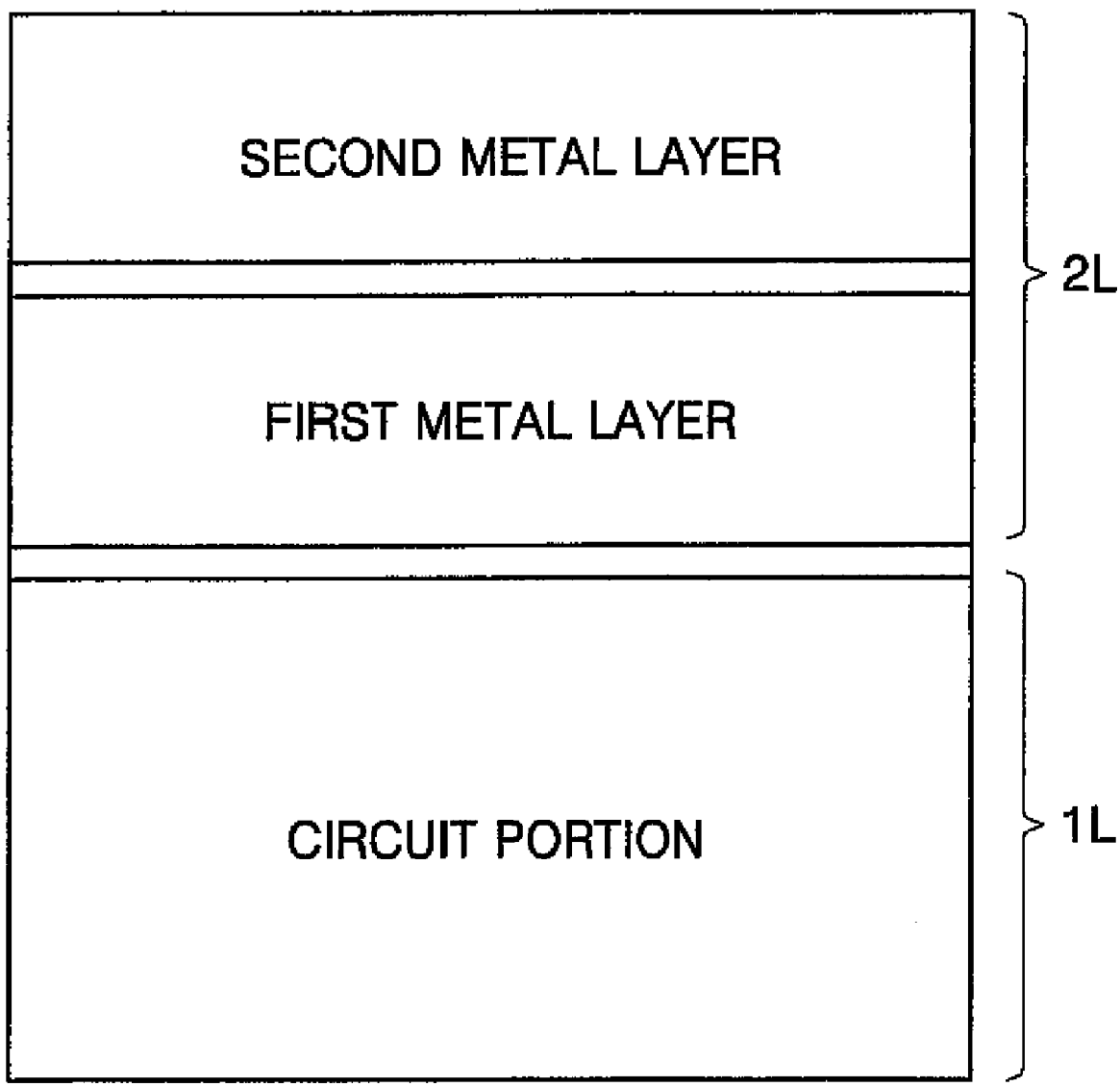
FIG. 5 shows a vertical structure of the semiconductor memory device of FIG. 3.

FIG. 5 shows a vertical structure of the semiconductor memory device of FIG. 3 which includes a circuit portion of lower layer 1L and an upper layer 2L having first and second metal layers. The circuit portion, the first metal layer and the second metal layer are insulated from each other. The circuit portion of lower layer 1L includes word line WL, bit line BL, and signal lines connecting transistors which form integrated circuits. The main word line may be arranged on the first metal layer and a column selecting signal line may be arranged on the second metal layer. Alternatively, the column selecting signal line may be arranged on the first metal layer and the main word line may be arranged on the second metal layer. The signal line SL shown in FIG. 4 may be arranged on the circuit portion of lower layer 1L or on the first or second metal layer depending on where the main word line NWL is not disposed. For example, if signaline SL is on the second metal layer of upper layer 2L then the main word line NWL is on the first metal layer. Alternatively, if the signal line SL is on the first metal layer of upper layer 2L then the main word line NWL is on the second metal layer. Although the structure of FIG. 5 illustrates two metal layers, it may have three or more metal layers in upper layer 2L. In this arrangement, the main word line NWL and the signal line SL would be on different layers when the signal line SL is disposed on one of the three or more metal layers.

In this manner, the semiconductor memory device having the disclosed word line strap structure reduces the length C' (shown in FIG. 4) of conjunction portion CJ by dispersely arranging circuits in the contact and conjunction portion CT&CJ which were previously disposed in conjunction portion CJ of the memory cell array.

Figure 6:
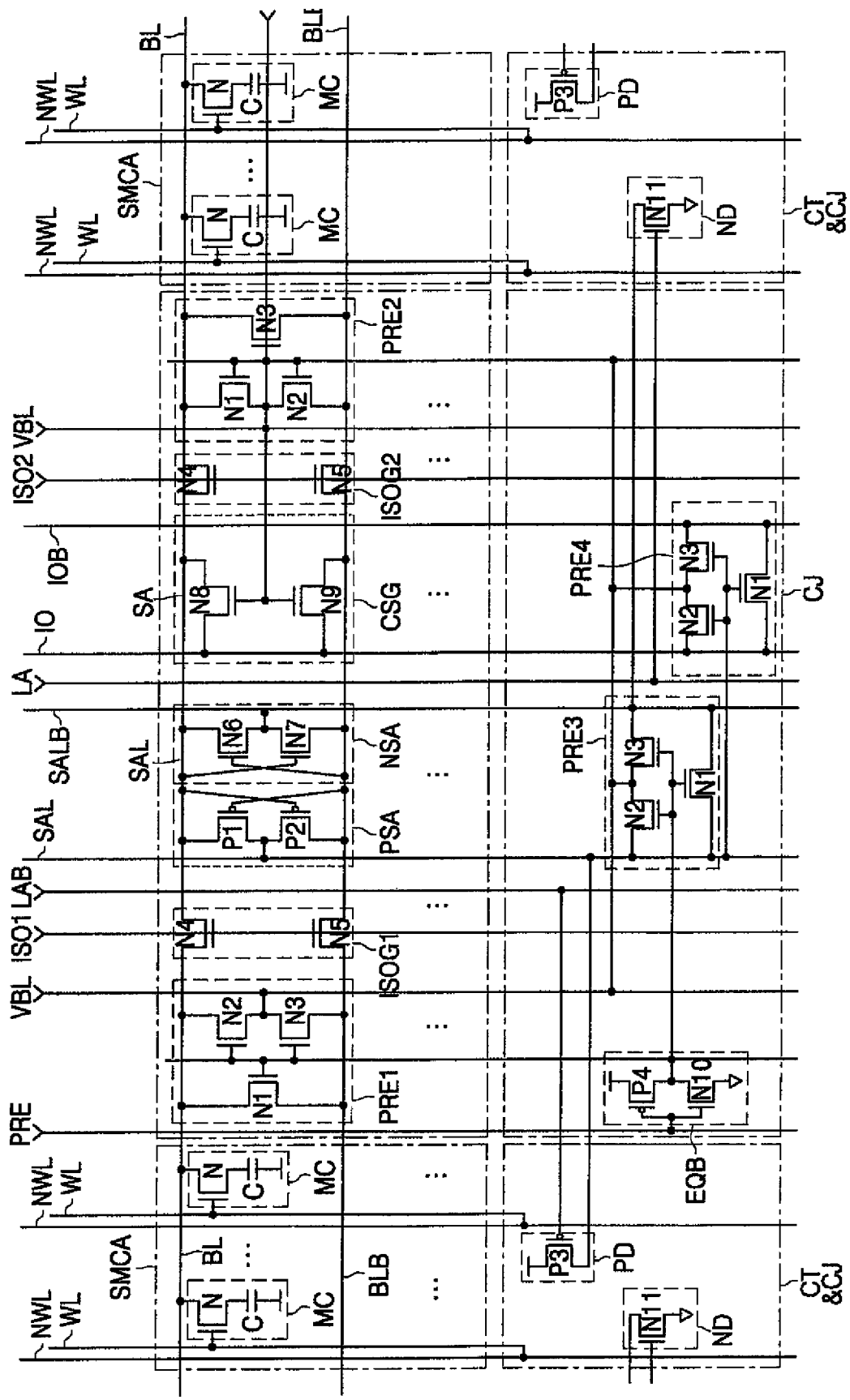
FIG. 6 shows a configuration of the memory cell array of FIG. 4.

FIG. 6 is a schematic illustration of the memory cell array of FIG. 4. Sub-memory cell array SMCA includes a plurality of memory cells MC. Sense amplifying portion SA includes bit line pre-charge circuits PRE1 and PRE2, bit line isolation gates ISOG1 and ISOG2, a PMOS sense amplifying portion PSA, an NMOS sense amplifier NSA, and a column selecting gate CSG. Conjunction portion CJ includes sensing line pre-charge circuit PRE3, data IO line pre-charge circuit PRE4, and a pre-charge driving buffer EQB. Conjunction portion CJ is disposed between contact and conjunction portions CT & CJ. Each of the contact and conjunction portions CT & CJ include a PMOS sense amplifier driver PD and an NMOS sense amplifier driver ND. The contact and conjunction portions CT & CJ are arranged between the sub-memory cell array regions SMCA in a word line WL direction together with contacts for connecting main word line NWL and word line WL. One of the PMOS sense amplifier driver PD and NMOS sense amplifier driver ND of contact and conjunction portion CT & CJ is connected to conjunction portion CJ disposed at the left edge of the array. PMOS sense amplifier driver PD and NMOS sense amplifier driver ND of the other contact and conjunction portion CT & CJ is connected to conjunction portion CJ disposed at the right edge of the memory array. Alternatively, two PMOS sense amplifier drivers PD may be arranged in contact and conjunction portion CT & CJ at the right edge of the conjunction portion CJ, and two NMOS sense amplifier drivers ND may be arranged in the contact and conjunction portion CT & CJ at the left edge of the memory array.

Each of a plurality of memory cells MC comprises an NMOS transistor N and capacitor C. Each of the pre-charge circuits PRE1-PRE4 comprises NMOS transistors N1-N3. Each of the bit line isolation gates ISOG1 and ISOG2 comprises NMOS transistors N4 and N5. PMOS sense amplifier PSA comprises PMOS transistors P1 and P2 and the NMOS sense amplifier NSA comprises NMOS transistors N6 and N7. Pre-charge driving buffer EQB comprises PMOS transistor P4 and an NMOS transistor N10. PMOS sense amplifier driver PD comprises PMOS transistor P3 and NMOS sense amplifier driver ND comprises NMOS transistor N11.

Pre-charge driving buffer EQB turns on PMOS transistor P4 to generate a signal in response to a pre-charge control signal PRE of a low level during a pre-charge operation and also turns on NMOS transistor N10 to generate a ground voltage signal in response to the pre-charge control signal PRE of a high level during a write and read operation. Each bit line pre-charge circuit PRE1 and PRE2 turn on NMOS transistors N1-N3 to pre-charge bit line pair BL and BLB and sense bit line pair SBL and SBLB (not shown) to a pre-charge voltage VBL in response to the power voltage level signal during the pre-charge operation. Bit line isolation gates ISOG1 and ISOG2 turn on NMOS transistors N4 and N5 to connect bit line BL and sense bit line SBL. Transistors N4 and N5 also turn on to connect inverted bit line BLB and inverted sense bit line SBLB in response to isolation control signals ISO1 and ISO2, respectively. PMOS sense amplifier PSA turns on PMOS transistors P1 and P2 to detect the low level signal of sense bit line pair SBL and SBLB. PMOS transistors P1 and P2 amplify the signal to the power voltage level when the power voltage level is applied to sensing line SAL during the read operation. The NMOS sense amplifier NSA turns on the NMOS transistors N6 and N7 to detect the high level signal of sense bit line pair SBL and SBLB. NMOS transistor N6 and N7 amplify the low level signal to the ground voltage level when the ground voltage level signal is applied to sensing line SALB during the read operation. Column selecting gate CSG turns on to transmit a signal between sense bit line pair SBL, SBLB and data IO line pair IO, IOB in response to column selecting signal during the read and write operations. PMOS sense amplifier driver PD turns on PMOS transistor P3 to the power voltage level to sensing line SAL in response to the sense amplifier SA driving signal LAB during the read operation. NMOS sense amplifier driver ND turns on NMOS transistor N11 to generate to the inverted sensing line SALB the ground voltage level in response to sense amplifier driving signal LA at a high level during the read operation. The sensing line pre-charge circuit PRE3 turns on NMOS transistors N1-N3 to pre-charge sensing line pair SAL and SALB in response to the power voltage level signal outputted from pre-charge driving buffer EQB during the pre-charge operation. The NMOS transistors N1-N3 are turned off in response to the ground voltage level signal outputted from pre-charge driving buffer EQB during the write and read operations. Data IO line pre-charge circuit PRE4 turns on NMOS transistors N1-N3 to pre-charge the data IO line pair IO and IOB to pre-charge voltage level VBL in response to the power voltage level signal of sensing line SAL during the write and read operations and turns off the NMOS transistors N1 to N3 in response to ground voltage level signal of sensing line SAL.

The area occupied by NMOS transistor N11 and PMOS transistor P3 is larger than the area occupied by transistor P4 of pre-charge driving buffer EQB, transistors N1-N3 of pre-charge circuit PRE3, and transistor N10 of pre-charge circuit PRE4. Thus, the layout area size of the memory array is larger. However, the length of conjunction portion CJ is reduced by arranging transistors P3 and N11 in contact portion CT of the conventional memory cell array.

Figure 7:
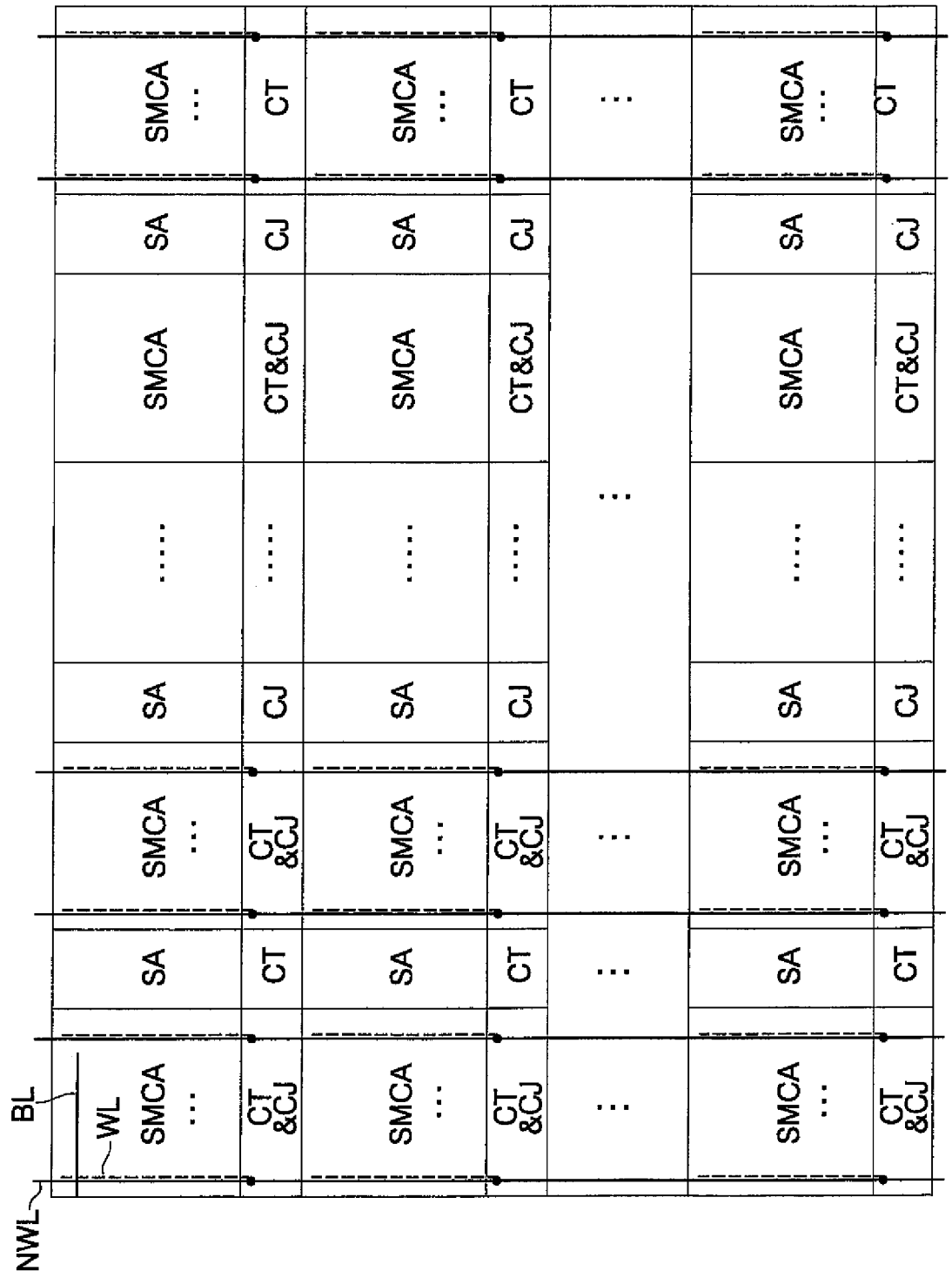
FIG. 7 shows a memory cell array of a semiconductor memory device according to an exemplary embodiment of the present invention.

FIG. 7 shows a memory cell array similar to that of FIG. 1 except for the arrangement of contact portion CT. In particular, sub-memory cell array SMCA and sense amplifying portion SA are alternately arranged in a bit line BL direction. Sub memory cell array SMCA and contact and conjunction portion CT & CJ are alternately arranged in a word line WL direction. Sense amplifying portion SA and conjunction portion CJ are alternately arranged in a word line WL direction. Sub memory cell array SMCA and the portion CT are alternately arranged in a word line direction toward the right edge of the memory cell array. Alternatively, sub-memory cell array SMCA and contact portion CT may be alternately arranged in a word line direction toward the left edge of the memory cell array. Unlike the arrangement of the memory cell array shown in FIG. 3 in which the contact portion CT is arranged in a portion of the region between sub-memory cell arrays SMCA in a word line direction, the memory cell array of FIG. 7 illustrates contact portion CT arranged in the region between the sub-memory cell arrays SMCA in a word line direction toward the left or right edge of the array.

Figure 8:
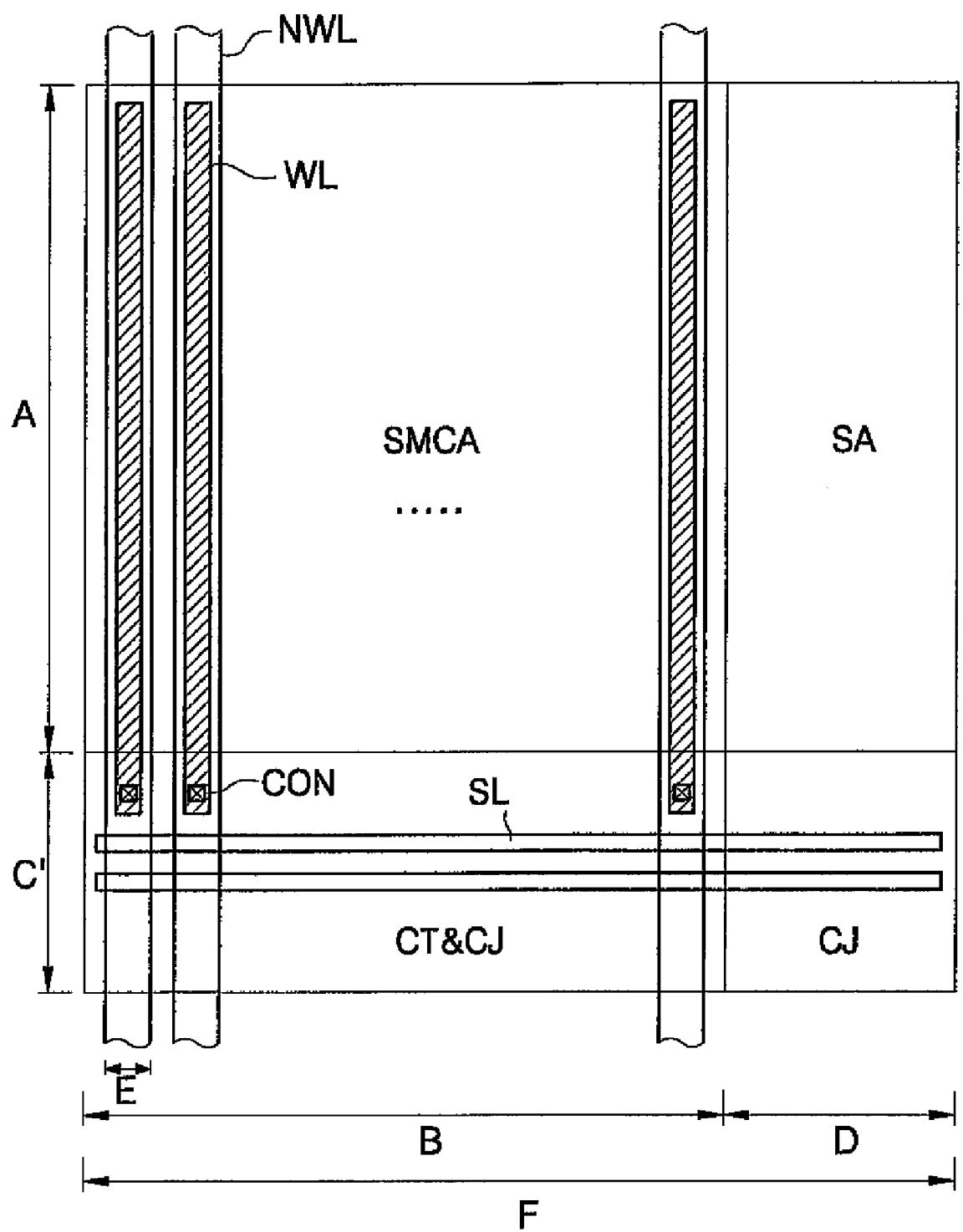
FIG. 8 shows a portion of the memory cell array of FIG. 7.

FIG. 8 shows a portion of the memory cell array of FIG. 7 where the circuits for sense amplifying portion SA adjacent to conjunction portion CJ are arranged in contact and conjunction portion CT & CJ toward the left side of conjunction portion CJ. The circuit for conjunction portion CJ is dispersed in the contact and conjunction portion CT & CJ as well as conjunction portion CJ. Contact CON is disposed away from the center of contact and conjunction portion CT & CJ. Word line WL is disposed on the lower layer of the region where sub-memory cell array SMCA is located while main word line NWL (made of metal) is arranged on the upper layer which overlaps word line WL. Contact CON connects word line WL and main word line NWL of sub-memory cell array SMCA and some of the circuits of conjunction portion CJ are disposed in contact and conjunction portion CT & CJ. Thus, the length C' of conjunction portion CJ is reduced and the layout area size of the memory cell array is reduced. Signal lines SL are arranged in a bit line BL direction and connect the circuits in conjunction portion CJ between sense amplifiers SA arranged in the word line direction WL and the circuits on the conjunction portion CJ between sub-memory cell arrays SMCA and also arranged in a word line direction WL. The length of conjunction portion CJ is reduced by extending the circuits arranged in conjunction portion CJ and dispersely arranging these circuits (as shown in FIG. 3), thereby reducing the layout area size of the memory cell array. The word line strap structure of the semiconductor memory device narrows the width of the metal line forming the main word line widens the width of the region where the conjunction portion CJ is arranged and dispersely arranges the circuits associated with conjunction portion CJ which significantly reduces the layout area size of the memory cell array.

Although the present invention has been described in connection with the embodiment of the present invention illustrated in the accompanying drawings, it is not limited thereto. It will be apparent to those skilled in the art that various substitutions, modifications and changes may be thereto without departing from the scope and spirit of the invention.

What is claimed is:

1. A semiconductor memory device having a memory cell array comprising:
    sub-memory cell arrays arranged in a bit line direction and a word line direction perpendicular to said bit line direction, each of said sub-memory cell arrays having a plurality of memory cells;
    sense amplifying portions arranged between said sub-memory cell arrays in said bit line direction;
    contact and conjunction portions arranged between said sub-memory cell arrays in said word line direction;
    conjunction portions arranged between said sense amplifiers in said word line direction; and
    a main word line overlaps a word line of said sub-memory cell arrays in said word line direction.

2. The semiconductor memory device of claim 1, wherein the contact and conjunction portion further comprises a contact for connecting said main word line and each of the word lines of said sub-memory cell arrays configured to overlap said main word line.

3. The semiconductor memory device of claim 1, wherein each of said sense amplifying portions includes a first circuit, said first circuit comprising:
   a PMOS sense amplifier detecting a voltage difference of bit line pairs arranged in said bit line direction, said PMOS sense amplifier configured to amplify data of one line of the bit line pairs to data of a high level to be applied to a sensing line;
   an NMOS sense amplifier detecting a voltage difference of each of the bit line pairs to amplify data of the other line of bit line pairs to a low level to be applied to an inverted sensing line; and
   a bit line pre-charge circuit for pre-charging each of the bit line pairs to a pre-charge voltage level in response to a pre-charge control signal.

4. The semiconductor memory device of claim 3, wherein each of said contact and conjunction portions includes a second circuit and each of said conjunction portions includes a third circuit, said second and third circuits comprising:
   a pre-charge buffer for buffering a pre-charge signal to generate said pre-charge control signal;
   a sensing line pre-charge circuit for pre-charging said sensing line and said inverted sensing line to the pre-charge voltage level in response to the pre-charge control signal;
   a PMOS sense amplifier driver for driving said sensing line in response to a sensing control signal; and
   an NMOS sense amplifier driver for driving said inverted sensing line in response to an inverted sensing control signal.

5. The semiconductor memory device of claim 4, wherein said first circuit further comprises a data IO gate for transmitting data between said bit line pair and a data IO line pair in response to a column selecting signal.

6. The semiconductor memory device of claim 4, wherein said second and third circuits further comprise a data IO line pre-charge circuit for pre-charging a data IO line pair to said pre-charge voltage level in response to a signal of said sensing line.

7. The semiconductor memory device of claim 4 further comprising:
   a contact portion disposed in a portion of a region between said sub-memory cell arrays in said word line direction toward an edge of the memory cell array; and
   a contact and conjunction portion including a fourth circuit arranged in the remaining region between said sub-memory cell arrays in said word line direction arranged toward said edge of the memory cell array.

8. The semiconductor memory device of claim 7, wherein said second circuit includes said PMOS sense amplifier driver and said NMOS sense amplifier driver.

9. The semiconductor memory device of claim 7, wherein said third circuit includes said pre-charge buffer and said sensing line pre-charge circuit.

10. The semiconductor memory device of claim 7, wherein said fourth circuit includes said PMOS sense amplifier driver and the NMOS sense amplifier driver.

11. The semiconductor memory device of claim 7, wherein said fourth circuit includes said NMOS sense amplifier driver.

12. The semiconductor memory device of claim 7, wherein said second circuit further comprises two PMOS sense amplifier drivers.

13. The semiconductor memory device of claim 7, wherein said second circuit further comprises two NMOS sense amplifier drivers.

14. The semiconductor memory device of claim 7, wherein said third circuit includes said pre-charge buffer and said sensing bit line pre-charge circuit, and the fourth circuit includes said PMOS sense amplifier driver.

15. The semiconductor memory device of claim 7, wherein said third circuit includes said pre-charge buffer and said sensing bit line pre-charge circuit, and the fourth circuit includes said NMOS sense amplifier driver.

16. The semiconductor memory device of claim 4 further comprising a contact portion arranged between said sub-memory cell arrays arranged in said word line direction toward one side of an edge of said memory cell array.

17. The semiconductor memory device of claim 16, wherein said second circuit includes said PMOS sense amplifier driver and said NMOS sense amplifier driver.

18. The semiconductor memory device of claim 16, wherein said third circuit includes said pre-charge buffer and said sensing line pre-charge circuit.

19. The semiconductor memory device of claim 4, wherein said main word line is made of metal and crosses the sub-memory cell arrays arranged in said word line direction, said memory device further comprising a first signal line for transmitting said pre-charge control signal, a second signal line for transmitting the sensing signal and a third signal line for transmitting the inverted sensing signal, each of first, second and third signal lines arranged in a bit line direction on a different layer of said memory device with respect to a layer where said main word line is arranged.

20. An arrangement method of a semiconductor memory device comprising:
   arranging sub-memory cell arrays including a plurality of memory cells respectively in a bit line direction and a word line direction, said word line direction perpendicular to said bit line direction;
   arranging sense amplifying portions between said sub-memory cell arrays arranged in said bit line direction, each of said sense amplifying portions having a first circuit;
   arranging contact and conjunction portions between said sub-memory cell arrays arranged in said word line direction, each of said contact and conjunction portions having a second circuit; and
   arranging conjunction portions between said sense amplifiers arranged in said word line direction, each of said conjunction portions having a third circuit,
   arranging a main word line to overlap a word line between said sub-memory cell arrays arranged in said word line direction.

21. The method of claim 20, wherein said first circuit comprises:
   a PMOS sense amplifier for detecting a voltage difference between bit line pairs arranged in said bit line direction, said PMOS sense amplifier configured to amplify data of one of said bit line pairs to data of a high level and applied to a sensing line;
   an NMOS sense amplifier for detecting a voltage difference between each of said bit line pairs, said NMOS sense amplifier configured to amplify data of the other line of said bit line pairs associated with said PMOS sense amplifier to a low level and applied to an inverted sensing line; and
   a bit line pre-charge circuit for pre-charging each of said bit line pairs to a pre-charge voltage level in response to a pre-charge control signal.

22. The method of claim 21, wherein said second and the third circuits each further comprise:

a pre-charge buffer for buffering a pre-charge signal to generate said pre-charge control signal during a pre-charge operation;

a sensing line pre-charge circuit for pre-charging said sensing line and said inverted sensing line to said pre-charge voltage level in response to the pre-charge control signal during the pre-charge operation;

a PMOS sense amplifier driver for driving said sensing line in response to a sensing control signal; and an NMOS sense amplifier driver for driving said inverted sensing fine in response to an inverted sensing control signal.

23. The method of claim 22, wherein said second circuit further comprises said PMOS sense amplifier driver and said NMOS sense amplifier driver and said third circuit includes said pre-charge buffer and said sensing line pre-charge circuit.

24. The method of claim 22, further comprising:

arranging a contact portion in a portion of the region between said sub-memory cell arrays arranged in said word line direction toward an edge of said memory cell array; and arranging a contact and conjunction portion including a fourth circuit in the remaining region between said sub-memory cell arrays arranged in said word line toward said edge of said memory cell array.

25. The method of claim 24 wherein said fourth circuit further comprises said PMOS sense amplifier driver.

26. The method of claim 24 wherein said fourth circuit further comprises said NMOS sense amplifier driver.

27. The method of claim 22, further comprising, arranging a contact portion disposed between said sub-memory cell arrays arranged in said word line direction toward one side of an edge of said memory cell array.

28. The method of claim 22, wherein said main word line is made of metal, said memory array including a first signal line for transmitting the pre-charge control signal, a second signal line for transmitting the sensing signal and a third signal line for transmitting the inverted sensing signal, said method further comprising:

arranging said main word line to cross said sub-memory cell arrays arranged in said word line direction; and, arranging each of said first, second and third signal lines in said bit line direction on a different layer of said memory device with respect to a layer where said main word line is arranged.

* * * * *